United States Patent [19]
Germini

[11] Patent Number: 5,696,461
[45] Date of Patent: Dec. 9, 1997

[54] POWER-ON RESET CIRCUIT

[75] Inventor: Valeria Germini, Monza, Italy

[73] Assignee: SGS-Thomson Microelectronics S.r.l., Agrate Brianza, Italy

[21] Appl. No.: 521,666

[22] Filed: Aug. 31, 1995

[30] Foreign Application Priority Data

Aug. 31, 1994 [EP] European Pat. Off. ............ 94830417

[51] Int. Cl.$^6$ ...................................... H03L 7/00
[52] U.S. Cl. .................... 327/143; 327/142; 327/198
[58] Field of Search .................... 327/143, 198, 327/142, 80, 81, 434

[56] References Cited

U.S. PATENT DOCUMENTS

| | | | |
|---|---|---|---|
| 4,633,107 | 12/1986 | Norsworthy | 307/594 |
| 4,697,097 | 9/1987 | Rusznyak | 327/143 |
| 4,818,904 | 4/1989 | Kobayashi | 327/143 |
| 4,948,995 | 8/1990 | Takahashi | 307/594 |
| 4,970,408 | 11/1990 | Hanke et al. | 307/272.3 |
| 4,983,857 | 1/1991 | Steele | 307/272.3 |
| 5,151,614 | 9/1992 | Yamazaki et al. | 327/143 |
| 5,172,012 | 12/1992 | Ueda | 307/272.3 |
| 5,321,317 | 6/1994 | Pascucci et al | 327/143 |
| 5,323,067 | 6/1994 | Shay | 307/272.3 |
| 5,534,804 | 7/1996 | Woo | 327/143 |

FOREIGN PATENT DOCUMENTS

| | | |
|---|---|---|
| 0 333 405 | 9/1989 | European Pat. Off. . |
| 63-266921 | 11/1988 | Japan . |
| 6-097796 | 4/1994 | Japan . |
| 2 059 707 A | 4/1981 | United Kingdom . |

OTHER PUBLICATIONS

Piasecki, Statutory invention registration, No. H497, Jul. 1988.

*Primary Examiner*—Timothy P. Callahan
*Assistant Examiner*—Jung Ho Kim
*Attorney, Agent, or Firm*—David V. Carlson; Seed and Berry LLP

[57] ABSTRACT

A threshold detection circuit for generating a detection signal when a power supply voltage exceeds a predetermined threshold. The threshold detection circuit comprises a first detection stage, a second detection stage, and a control circuitry. The first detection stage is connected between the power supply voltage and a reference voltage, and includes a first pull-up device and a first switching device connected in series and provides a control node therebetween. The second detection stage is connected between the power supply voltage and the reference voltage and includes a controllable pull down device and a second switching device connected in series, and provides an output node therebetween. The controllable pull down device has a control terminal coupled to the control node. Finally, the control circuitry controls the first and second switching devices to prevent a DC path between the power supply voltage and the reference voltage outside an operational voltage range of the threshold detection circuit.

10 Claims, 6 Drawing Sheets

R (Reset signal)

Voltage at reference node 109

Voltage at output B

| | SELECTED CELL | | | UNSELECTED CELL SAME ROW | | | UNSELECTED CELL SAME COLUMN | | |
|---|---|---|---|---|---|---|---|---|---|
| | DRAIN VOLTAGE | GATE VOLTAGE | SOUCE VOLTAGE | DRAIN VOLTAGE | GATE VOLTAGE | SOUCE VOLTAGE | DRAIN VOLTAGE | GATE VOLTAGE | SOUCE VOLTAGE |
| PROGRAM | ~5V | Vpp | $V_{GND}$ | $V_{GND}$ | Vpp | $V_{GND}$ | ~5V | $V_{GND}$ | $V_{GND}$ |
| ERASE* | FLOATING | $V_{GND}$ | Vpp | FLOATING | $V_{GND}$ | Vpp | FLOATING | $V_{GND}$ | Vpp |
| READ | BIASED TO ~1V | ~5V | $V_{GND}$ | $V_{GND}$ | ~5V | $V_{GND}$ | BIASED TO ~1V | $V_{GND}$ | $V_{GND}$ |

\* ALL CELLS SELECTED IN ERASE

FIG. 6

POWER-ON RESET CIRCUIT

TECHNICAL FIELD

The present invention relates to integrated circuits and, in particular, to a power-on reset circuit for use in the integrated circuits.

BACKGROUND OF THE INVENTION

Power-on reset circuits have many applications in the field of electronics. For example, reset circuits are used in memory circuits to ensure that when there is sufficient supply potential to allow the proper operation of the memory, all the logic elements are in a specified initial state. Without reset circuitry, the logic elements would initially have random logic states. This is obviously undesirable as proper operation of the memory circuits cannot be guaranteed.

One known power-on reset circuit shown by way of background in U.S. Pat. No. 4,983,857, incorporated herein by reference, comprises a resistor and capacitor connected in series between a supply voltage and ground. An output is taken from the common node between the capacitor and resistor and coupled to the input of an inverter. The reset signal is generated at a predetermined time after power-up has commenced. As the generation of the reset signal is time dependent, rather than related to the level of the supply voltage, the reset signal may be generated before the voltage has reached a level at which the circuit can operate normally. This problem can be addressed by increasing the predetermined time but this has its own disadvantage in that an external system may try to access a circuit before it has been reset.

Another known arrangement shown in the same patent comprises two FET devices connected between a power supply voltage and the input to an inverter. A further FET is connected between the input to the inverter and a reference voltage (e.g., ground). A capacitor, in parallel with the further FET, is connected between the inverter input and the reference voltage. Current flows through the FET devices to charge the capacitor only when the supply voltages are greater than the sum of the absolute values of the threshold voltages. The output of the inverter is used as the power-on reset signal. However, such a circuit has the problem that even when Vcc has exceeded the threshold value, a DC path between the Vcc supply and ground is present. This means that power will be needlessly dissipated by the power-on reset circuit, even after it has generated the reset signal.

It is therefore an object of the present invention to provide a threshold detection circuit which is simple and reliable and which may be used as a power-on reset circuit. It is also an object of the present invention to provide a threshold detection circuit which does not needlessly dissipate power.

SUMMARY OF THE INVENTION

According to one aspect of the present invention, there is provided a threshold detection circuit for generating a detection signal when a power supply voltage exceeds a predetermined threshold. The threshold detection circuit comprises a first detection stage, a second detection stage or output stage, and a control circuitry. The first detection stage is connected between the power supply voltage and a reference voltage, and includes a first pull up device and a first switching device connected in series, defining a control node therebetween. The second detection stage is connected between the power supply voltage and the reference voltage and includes a controllable pull down device and a second switching device connected in series, defining an output node therebetween. The controllable pull down device has a control terminal coupled to the control node. Finally, the control circuitry controls the first and second switching devices to prevent a DC path between the power supply voltage and the reference voltage outside an operational voltage range of the threshold detection circuit.

The control circuitry is able to avoid a DC path being formed between the power supply nodes outside the operational voltage range. In general, a DC path is one in which current is able to flow between two power supply lines at different potentials. The current flow results in power dissipation. The current in the threshold detection circuit of the present invention will be substantially zero once the voltage exceeds the predetermined threshold and the detection signal has been produced. Thus, needless power dissipation can be avoided.

Preferably the upper end of the operational voltage range is substantially equal to predetermined threshold. Thus, power dissipation and DC paths in the circuit can be avoided once the predetermined threshold has been exceeded. The lower end of the operational voltage range may be greater than or equal to the reference voltage and is less than the predetermined threshold. The lower end of the operational voltage range may be defined by the threshold voltage of the first pull up device.

Preferably the first pull up device is off until the lower end of operational voltage range is exceeded and is then on, and the first switching device is turned off by the control circuitry when the upper end of the operational voltage range is exceeded. It is preferred that the first controllable pull down device is off until the lower end of the operational voltage range is exceeded and the second switching device is turned off by the control circuitry when the upper end of the operational voltage range is exceeded.

Preferably the first pull up device is a natural, p-channel MOSFET. Natural p-channel MOSFETs tend to have a threshold value of around −1.6V, which may define the lower end of the operational voltage range. A particular advantage of using this natural p-channel MOSFET is that it makes the threshold detection circuit itself independent of the ramp rate of Vcc and is thus able to cope with ramp rates of for example between 50 microseconds to 5 milliseconds.

Preferably the second switching device acts as a pull up device and wherein the voltage level on the control node determines whether the controllable pull down device will pull down the output node against the pull up action of the second switching device. The controllable pull down device may be arranged to pull down the output node to a relatively low voltage level when the voltage level on the control node exceeds the predetermined threshold to thereby provide the detection signal at the output node.

The control circuitry preferably comprises first and second feedback inverters operable to switch off the first and second switching devices when the supply voltage exceeds the predetermined threshold. In this way, any DC paths present can be removed. First and second output inverters may be connected in series between the output node and an output of the circuit, the detection signal being provided at the output of the second output inverter. The inputs of the first and second feedback inventors may be connected to the output of the first output inverter.

Preferably the detection signal drops from a relatively high voltage level to a relatively low voltage level when the supply voltage exceeds the predetermined threshold. It is of course possible to provide that detection signal by transition from a relatively low state to a relatively high state. However, the transition from a high to low state is preferred as initially the "high state" actually follows the ramping of Vcc.

Preferably first and second switching devices and the first pull up device and the controllable pull down device are all MOSFET devices.

Preferably the threshold detection circuit is provided in a flash EPROM with the threshold detection circuit being operable to provide a reset signal when the power supply voltage exceeds the predetermined threshold. For a flash EPROM operating at around 3.3V, the operational voltage range may be between 1.6 and 2.2V with the predetermined threshold being 2.2V.

According to another aspect of the present invention, there is provided a threshold detection circuit for generating a detection signal when a power supply voltage exceeds a predetermined threshold. The threshold detection circuit comprises a detection stage and a control circuitry. The detection stage is connected between the power supply voltage and a reference voltage and includes in series a supply voltage detection device and a switching device connected between the power supply voltage node and a reference voltage node. The detection stage has an output node between the supply voltage detection device and the switching device. The output node is connected to detection signal generating circuitry and provides the detection signal. The control circuitry switches off the switching device when the supply voltage exceeds the predetermined threshold so that no DC current can flow in the detection stage between the power supply node and the reference voltage node respectively.

BRIEF DESCRIPTION OF THE DRAWINGS

An embodiment of the present invention will now be described by way of example and with reference to the accompanying drawings in which:

FIG. 6 is a table of the voltages which need to be applied to selected and unselected cells for each of a program, erase and read operation.

DETAILED DESCRIPTION OF THE INVENTION

Figure 1:
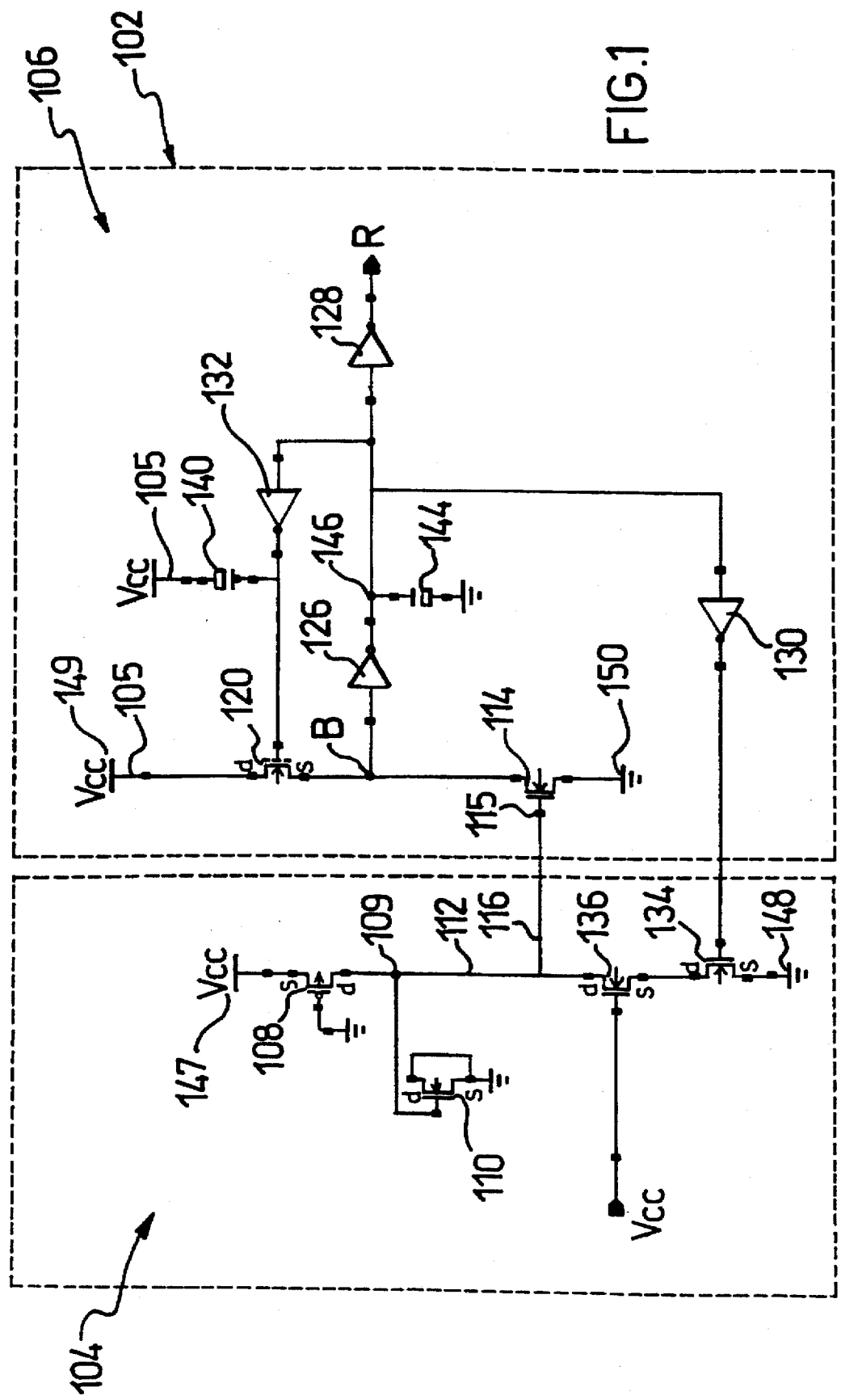
FIG. 1 shows a circuit embodying the present invention.

An embodiment of the present invention will now be described with reference to FIGS. 1 and 2. The power-on reset circuit 102 of FIG. 1 provides a reset signal for other circuits on a flash EPROM chip and has two main stages 104 and 106. The first stage acts as a threshold detector to detect when a supply voltage Vcc 105 exceeds a given threshold value. In this particular embodiment, the given threshold value is 1.6V. The second stage 106 of the circuit 102 is arranged to effectively increase the detection threshold of the circuit to about 2.2V. The overall threshold value (the circuit threshold) of the power-on reset circuit 102 is selected so as to be at a voltage level which is high enough to allow the correct functioning of other components on the flash EPROM chip. 2.2V is suitable for those flash EPROMs which use a normal operating voltage Vcc of 3.3V. This threshold voltage of 2.2V is also suitable for flash EPROMs which are able to use either 3.3 or 5V as the normal operating voltage. For flash EPROM chips using a normal operating voltage of 5V, 2.2V is also an appropriate threshold. In order to be effective to reset logic circuitry, the reset signal from the power on reset circuit 102 should be provided when Vcc reaches a value which is at least equal to the sum of the threshold voltage of an n-channel MOSFET and the threshold voltage of a p-channel MOSFET. The second stage 106 is arranged to provide a reset signal R when the Vcc supply voltage exceeds the circuit threshold value.

The first stage 104 has a pull up detection MOSFET 108 which is connected between a Vcc supply voltage node 147 and a control node 109. The pull up detection MOSFET 108 is a natural p-channel transistor, i.e., one in which an ion implant has not been provided in the channel. Typically, a p-channel device with an ion implanted channel will have a threshold voltage of around −0.8 or −0.9V. However, a p-channel natural device has a threshold voltage of around −1.6V. Thus the p-channel pull up detection MOSFET 108 has a threshold voltage of −1.6V and will therefore only be switched on when the Vcc supply voltage connected to the source 105 of the pull up detection MOSFET 108 exceeds 1.6V. The gate of the pull up detection MOSFET 108 is connected to ground. Typically the pull up detection MOSFET 108 has a width to length ratio of 4/6.

The first stage also has an n-channel filtering MOSFET 110 connected to the control node 109 which is arranged to act as a capacitor in order to filter against noise and glitches in the Vcc power supply 105. The source s and drain d of the filtering MOSFET 110 are both connected to ground while the gate is connected to the control node 109. The filtering MOSFET 110 typically has a width to length ratio of 20/10 and a threshold value of ~0.8V and a capacitance of ~0.4 pF.

The first stage 104 also has a n-type first switching MOSFET 134 with a typical width to length ratio of 10/8 and a threshold value of ~0.8V. The source s of the first switching MOSFET 134 is connected to a ground node 148 while the drain d of the first switching MOSFET 134 is connected to the source s of a further n-channel MOSFET 136 which acts as a power down switch. The drain d of the power down MOSFET 136 is connected to the control node 109 while its gate is connected to Vcc. The power down MOSFET 136 has a width to length ratio of 2/50 and a threshold value of ~0.8V. Both the first switching MOSFET 134 and the power down MOSFET 136 have a much lower current carrying capacity compared to the p-channel pull up detection MOSFET 108.

The second stage of the circuit 102 will now be described. Reference numeral 114 denotes an n-channel controllable pull down MOSFET, the gate 115 of which is connected by line 116 to the control node 109. The controllable pull down MOSFET 114 typically has a width to length ratio of 8/2 and a threshold voltage of ~0.8V. The source s of the controllable pull down MOSFET 114 is connected to a ground node 150 while its drain d is connected to the source s of a second pull up MOSFET 120. The controllable pull down MOSFET 114 has a current carrying capacity comparable to the second pull up MOSFET 120.

The second pull up MOSFET 120 is an n-channel natural transistor which typically has a width to length ratio of 8/3 and a threshold voltage close to zero volts. The second pull up MOSFET 120 acts as a switching device in addition to a pull up device as will be described hereinafter. The drain d of the second pull up MOSFET 120 is connected to a Vcc supply node 149.

A first output inverter 126 is arranged to receive an input from an output node A between the pull down device 114 and the second pull up device 120. The first output inverter 126 comprises as is well known, a p-channel and an n-channel device connected in series. These devices have width to length ratios as follows:

p-channel device 12/12 n-channel device 8/2

The trigger point of the first output inverter 1.5V. (When Vcc ~2.2V and is valued in DC).

The output of the first output inverter 126 is coupled to the input of a second output inverter 128 and first and second feedback inverter 130 and 132. The output of the second output inverter 128 provides a reset signal R. The output of the first feedback inverter 130 is connected to the gate of the first switching MOSFET 134 while the output of the second feedback inverter 132 is connected to the gate of the second pull up MOSFET 120.

Typical width to length ratios of respective n- and p-channel devices of the second output inverter 128 and the first and second feedback inverter 130 and 132 are given in the table below:

|  | p-channel device | n-channel device |
|---|---|---|
| Inverter 128 | 24 | 16 |
| Inverter 130 | 8 | 2/2 |
| Inverter 132 | 8/2 | 4 |

Finally, circuit 102 also includes a capacitor 140 provided between the Vcc supply 105 and the output of the second feedback inverter 132. The first capacitor 140 typically has a capacitance of 80 fF. A second capacitor is also provided between the output 146 of the first output inverter 126 and ground. The second capacitor typically has a capacitance of 0.4 pF. These two capacitors 140 and 144 are provided to ensure that at the beginning of the operation, node 146 is low (for a reasonable Vcc ramp rate) and the output of inverter 132 is at Vcc.

The operation of the power-on reset circuit 102 will now be described particularly with reference to FIG. 2. Three sets of conditions need to be considered:
1. Vcc<1.6V (up to $t_0$)
2. 2.2V<Vcc<1.6V (between $t_0$ and $t_1$)
3. Vcc 2.2V (from $t_1$)

When Vcc is less than 1.6V, the first pull up MOSFET 108 will be switched off as its threshold value is −1.6V. Thus the control node 109 will be at a low potential and consequently the controllable pull down MOSFET 114 will also be off. As the first pull up MOSFET 108 is off, there will be no direct current path between the Vcc supply node 147 and the ground node 148.

The second pull up MOSFET 120 receives a gate potential from the capacitor 140 at the output of the second feedback inverter 132 and will be on when Vcc exceeds its threshold value. The output node B is thus pulled up to a voltage equal to Vcc−Vtn where Vtn is the threshold voltage of the second pull up MOSFET 120. It will be appreciated that there is also no direct current path between the supply node 149 and the ground node 150 because the controllable pull down MOSFET 114 is off. As the output node B is pulled up to Vcc−Vtn, at the trigger point of the inverter 146, the output of the first output inverter 146 goes low. Thus, the outputs of the second output inverter 128 and the first and second feedback inverter 130 and 132 are all high. Thus the output R of the power-on reset circuit is high. Of course, because the inverter are powered by Vcc, the "high" value tracks Vcc, as shown in FIG. 2b. The high output of the second feedback inverter 132 has no further effect on the second pull up MOSFET 120 which is already on. As the output of the first feedback inverter 130 is high, the first switching MOSFET 134 is turned on but, as described above, a current is unable to flow in the path between the Vcc supply node 147 and the ground node 148 as the first pull up MOSFET 108 is off. The power down MOSFET 136 is also on.

When Vcc is between 1.6 and 2.2V, the first pull up MOSFET 108 turns on. Although the first switching MOSFET 134 and the power down MOSFET 136 are on, they are not able to pull the control node to ground as a result of their lower current carrying capacity as compared with the first pull up MOSFET 108. Thus, the control node 109 will be at a voltage equal to Vcc as the first pull-up MOSFET 108 is much less resistive as compared with the first switching MOSFET 134 and the power down MOSFET 136 and there is thus substantially no voltage drop across the first pull-up MOSFET 108. The voltage at node 109 therefore follows Vcc. The voltage on the gate of the controllable pull down MOSFET 114 is the same as that at control node 109. While the controllable pull down MOSFET 114 is switched on in this range of Vcc, the gate voltage applied is not great enough to allow the controllable MOSFET 114 to pull node B low. Accordingly, node B remains at a relatively high level.

When Vcc exceeds 2.2V, the voltage on the gate of the controllable pull down MOSFET 114 is sufficiently high to allow node B to be pulled to ground. When the controllable pull down MOSFET 114 has pulled node B low, the output of the first output inverter 126 becomes high. Thus the output of the second output inverter 128 becomes low. Accordingly, the reset signal has now changed its state as can be seen from FIG. 2b. The transition from the high state to low state of signal R provides the actual reset indication which is used by other circuits on the chip. The output of the second feedback inverter 132 is now low and accordingly the input on the gate of the second pull up MOSFET 120 is also low, thus turning this MOSFET off. This cuts off the DC path from the Vcc supply node 149 to the ground node 150. Likewise, the output of the first feedback inverter 130 turns the first switching MOSFET 134 off. The switching off of the first switching MOSFET 134 cuts off the DC path along line 112 between the Vcc supply 147 and the ground node 148.

Figure 2A:
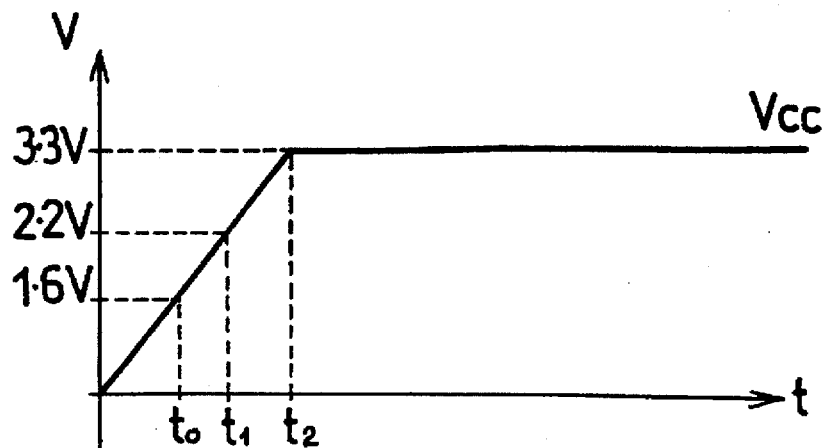
FIG. 2a shows a timing diagram for the supply voltage.
Figure 2B:
FIG. 2b shows a timing diagram for the reset signal.
Figure 2C:
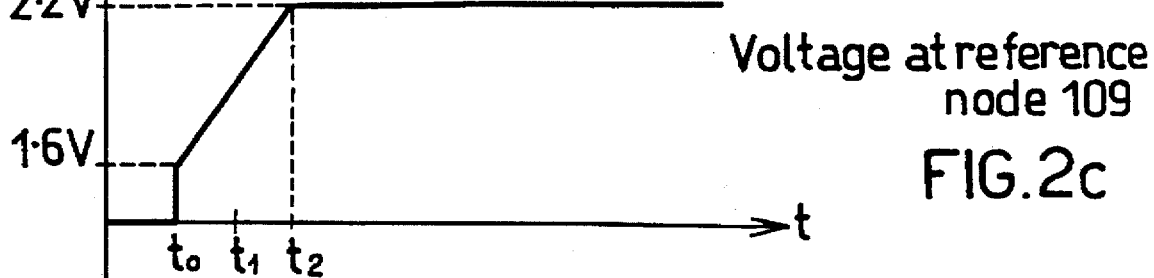
FIG. 2c shows a timing diagram for the voltage at the control node of the circuit of FIG. 1.

FIGS. 2a and 2b show the relationship between Vcc and the reset signal. As Vcc increases, the reset signal remains low until Vcc exceeds the threshold voltage of the p-channel device inside the second output inverter 128. The reset signal then follows Vcc because initially the input of the inverter 128 is kept low by capacitor 144. When Vcc reaches the circuit threshold, i.e., 2.2V, the reset signal R goes low. As previously discussed, the transition from a high level to a low level provides the actual reset indication. Signal R will then remain low.

Figure 2D:
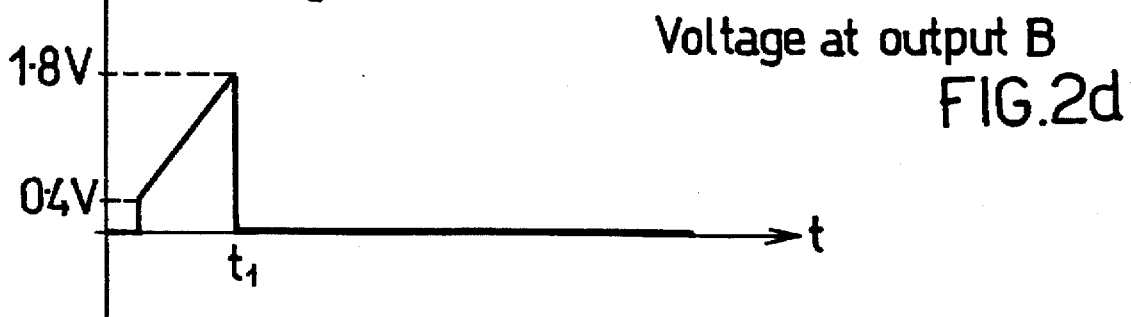
FIG. 2d shows a timing diagram for the voltage at node B of the circuit shown in FIG. 1.

The voltage at node B is similar to the output R of circuit 102 (FIG. 2d). The voltage at the control node 109 (FIG. 2c) is zero until Vcc exceeds 1.6V. After that the voltage at node 109 generally tracks Vcc.

It will be appreciated that the power-on reset circuit draws current only in the range of voltage from the threshold of the first pull up MOSFET 108 and the circuit threshold at which the output signal R changes state. Once the threshold value has been exceeded, there are no DC paths between any Vcc supply node and a ground node. This means that current is only drawn by the circuit in the critical operating range of the circuit (i.e., between 1.6V and 2.2V). As the power-on reset circuit will remain idle for a large proportion of the lifetime of a chip, this represents a significant power saving.

It will be appreciated that the specific values given for various components clan of course be changed. The illustrative embodiment of the present invention has been designed to have a threshold value of 2.2V and to be used on a flash memory chip which can be operated at 3.3 or 5V.

Figure 3:
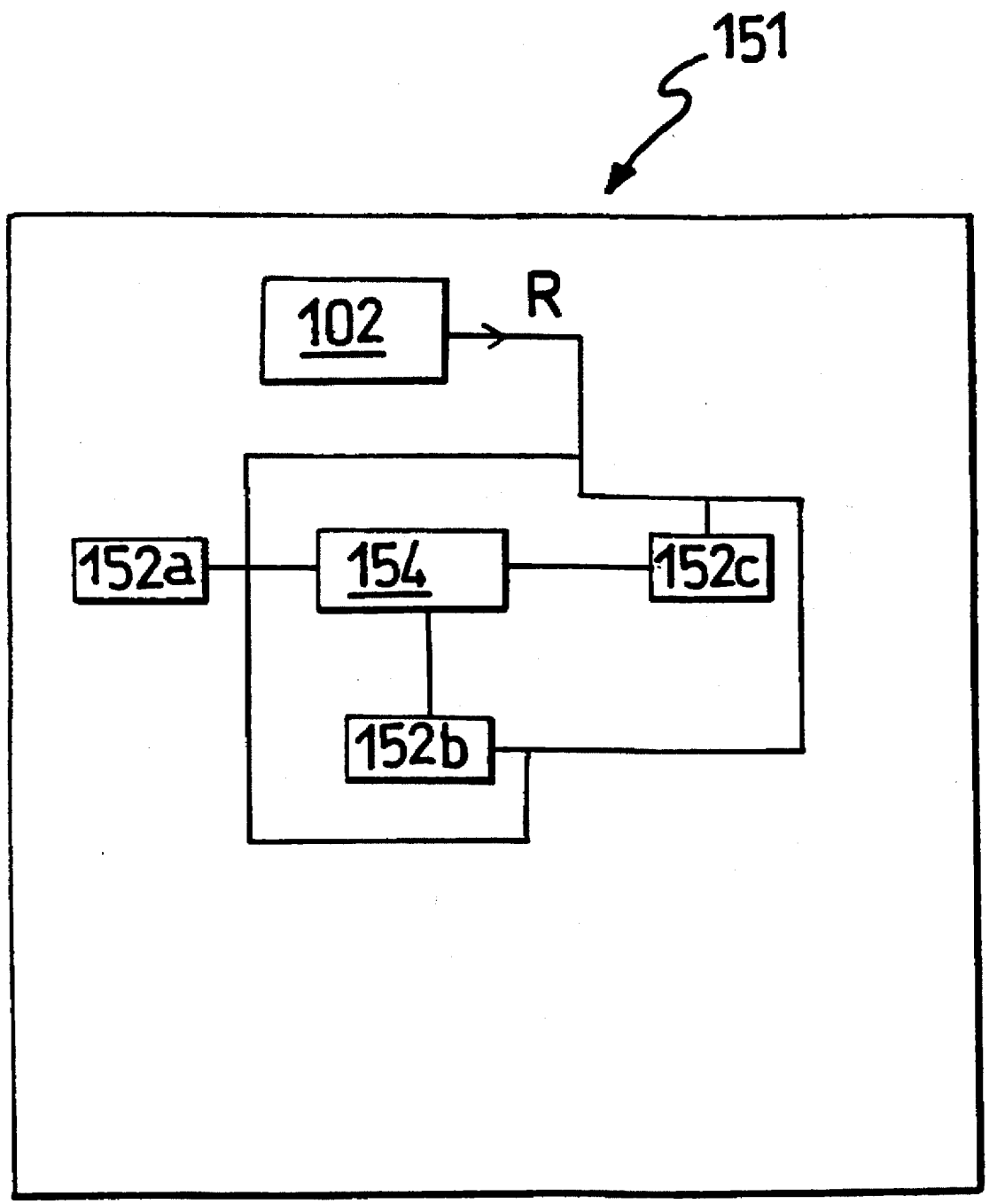
FIG. 3 shows a schematic view of a flash EPROM incorporating the power-on reset circuit shown in FIG. 1.

FIG. 3 shows a schematic illustration of a flash EPROM chip 151 incorporating the power-on reset circuit 102. The output of the circuit 102 is used to reset various logic circuits of the flash EPROM chip, for example logic circuits of peripheral circuits 152 which are used to control an array 154 of single transistor memory cells. The resetting of the logic circuits of the peripheral circuits enables other circuits in the peripheral circuits such as the erase circuitry. The peripheral circuits 152 take the form of, for example, erase circuitry 152a, programming circuitry 152b and reading circuitry 152c.

Figure 4:
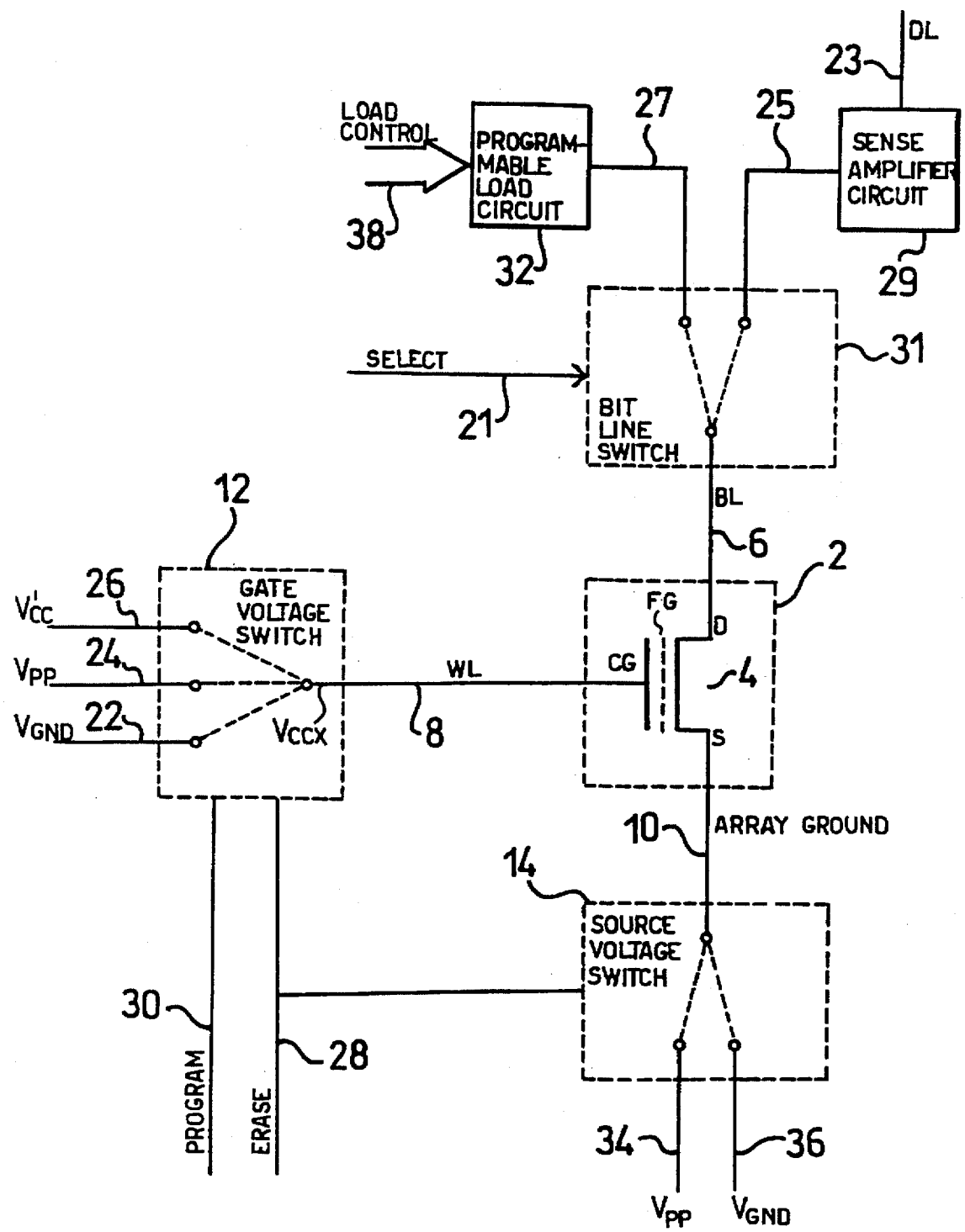
FIG. 4 is a schematic diagram of a flash memory cell.

A flash EPROM chip suitable for use with the invention is described in more detail in the following:

FIG. 4 illustrates a flash memory cell 2 comprising a single floating gate transistor 4 having a control gate CG, a floating gate FC, a source S, and a drain D. The source S of the floating gate transistor 4 is connected to an ARRAY GROUND signal on line 10. Through a source voltage switch circuit 14 this line 10 can be at a ground voltage VGND or a high voltage vpp. Voltage vpp represents a programming potential (typically 12V) and voltage VGND represents device ground. Vpp is normally connected to array ground via a resistor (not shown). The source voltage switch 14 is connected to the voltage Vpp via line 34 and the voltage VGND via line 36. The control gate CG of the floating gate transistor 4 is connected to a gate voltage switch 12 by a word line (WL) 8. The gate voltage switch 12 is further connected to voltages V'cc, Vpp and VGND on lines 26, 24 and 22, respectively. V'cc is at 5V for a 5V part or is boosted to about 5V for a 3V part. These switches 14 and 12 each receive a control signal ERASE on line 28 and additionally the gate voltage switch 12 receives a control signal PROGRAM on line 30. The drain D of the floating gate transistor 4 is connected to a bit line switch 31 by a bit line (BL) 6. The bit line switch is further connected to the input of a programmable load circuit 32 on line 27 and the input of a sense amplifier circuit 29 on line 25. The output of the sense amplifier circuit 29 on line 23 forms a data line (DL). The switch 31 receives a control signal SELECT on line 21. The programmable load circuit 32 receives load control signals on lines 38.

The flash memory has three modes of operation: program, erase and read. Each of these modes will be described hereinafter with reference to FIG. 4. The program mode involves writing a "0" to a memory cell or group of memory cells, the erase mode involves removing a "0" from any cell that has a "0" stored in it such that the cells all effectively store "1"s, and the read mode involves reading a cell to establish whether it is programmed or erased, i.e., either a "0" or a "1".

During a program mode, the control signal PROGRAM on line 30 is set such that the gate voltage switch 12 is configured to connect the voltage Vpp on line 24 to the control gate CG of transistor 4 via word line 8. As the control signal ERASE on line 28 is not set the source voltage switch 14 is configured to connect the voltage VGND on line 36 to the source of transistor 4 via the ARRAY GROUND signal line 10. The control signal SELECT on line 21 is set such that the bit line on line 6 is connected to the programmable load 32 by line 27. The load control signals 38 control the programmable load 32 so that a voltage of about 5V is on the drain D of the transistor 4 via the bit line 6. As a result of these signals applied to the transistor 4 the floating gate FG becomes negatively charged. The negative charge shifts the threshold voltage of the floating gate transistor making it less conductive. The amount of negative charge accumulated at the floating gate depends on the duration for which the control signal PROGRAM is set. In this way, a "0" is written into the cell. Normally, several program pulses are needed, each pulse being followed by a verify cycle.

During an erase mode, the control signal ERASE on line 28 is set such that the gate voltage switch 12 is configured to connect the voltage VGND on line 22 to the control gate CG of the transistor 4 via the word line 8, and such that the switch 14 is configured to connect the voltage Vpp on line 34 to the source S of the transistor 4 via the ARRAY GROUND line 10. The control signal SELECT on line 21 is again set such that the bit line 6 is disconnected so that it floats at a voltage of just under 1V. As the floating gate transistor is fabricated such that the source region in the substrate underlies the floating gate, any negative charge on the floating gate will be reduced. The amount of negative charge removed from the floating gate FG depends on the duration for which the ERASE signal on line 28 is set. The reduction of negative charge shifts the threshold voltage of the floating gate transistor making it more conductive. In this way the state of the cell is restored to "1". Normally, several erase pulses are required, each erase pulse being followed by a verify cycle.

During a read mode, neither the control signal ERASE on line 28 nor the control signal PROGRAM on line 30 is set. Consequently, the V'cc signal on line 26 is connected by the source voltage switch 12 to the control gate of the transistor 4 via the word line 8 and the voltage VGND on line 36 is connected to the source of the transistor 4 via the ARRAY GROUND signal line 10. The bit line 6 is biased to approximately 1 volt prior to a read operation by a bit line load (not shown) within the sense amplifying circuit. During a read operation, for an erased cell (with "1" stored in it) the conductivity of the cell is such that current passes through the cell when the bit line is connected for sensing. For a programmed cell (with a "0" stored in it) substantially no current is passed by the cell. The current drawn by the cell is compared with a reference current to detect the status of the cell.

The operation of a flash cell in a memory array will now be described with reference to FIG. 5. Signal lines or circuitry common to FIG. 4 can be identified in FIG. 5 by use of the same reference numerals. Voltage supplies have not been illustrated in FIG. 5 for reasons of clarity, but it will be understood with reference to FIG. 4 which voltages are required in various parts of the circuit.

Figure 5:
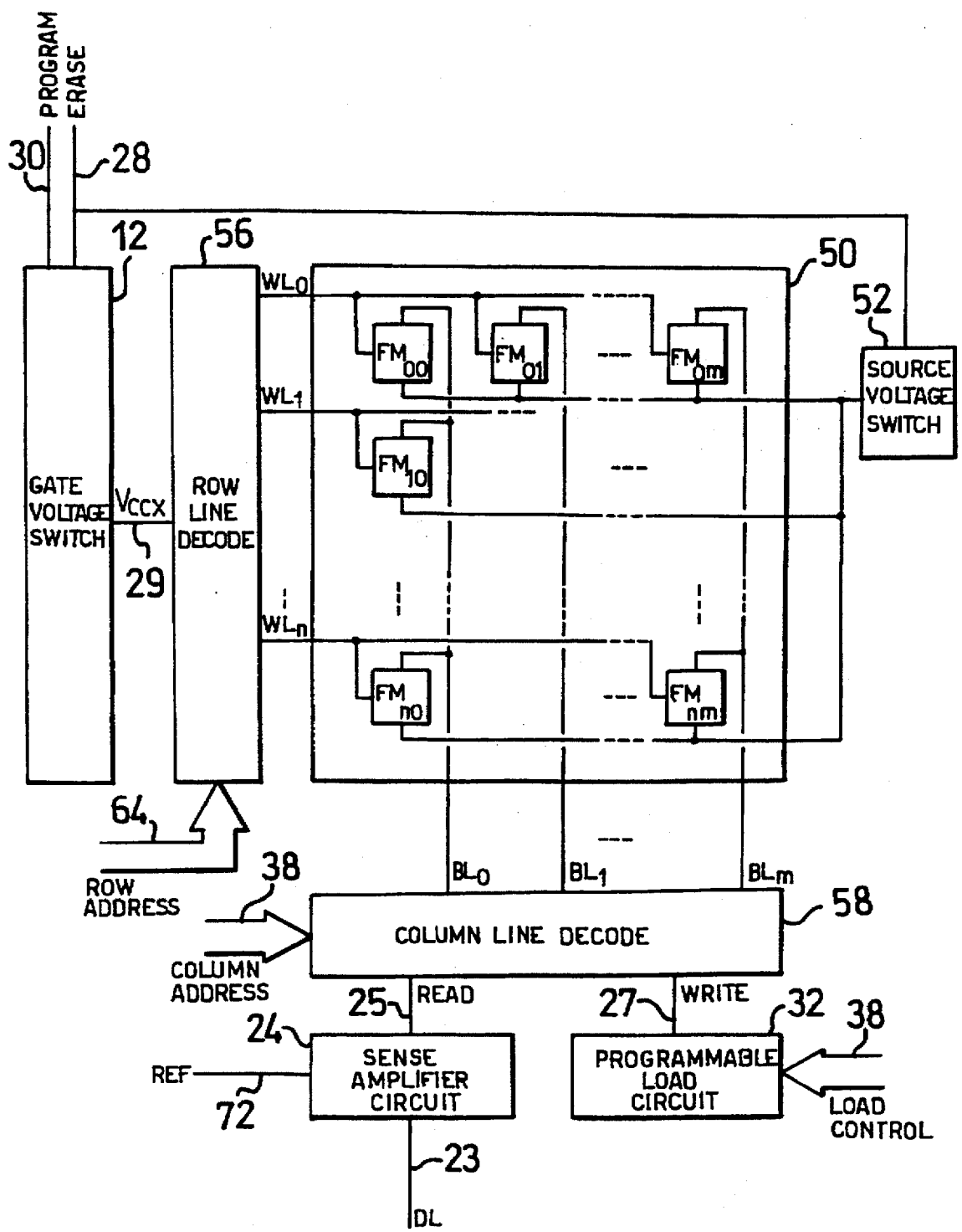
FIG. 5 is a schematic diagram of a flash memory array.

FIG. 5 illustrates a flash memory array 50 comprising a plurality of flash memory cells FMoo . . . FMnm, arranged in rows and columns, each of which can be the same as the cell 2 shown in FIG. 4. The gates of the transistors in each memory cell in a row are commonly connected to a respective word line WLo . . . WLn addressable by a row line decode circuit 56 which receives the row address 64. The gate voltage switch 12 responds to the control signals PROGRAM and ERASE on line 30 and 28 respectively, and supplies the appropriate gate voltage Vccx on line 29 to be switched to the addressed wordline through the row decode circuit 56.

The drains of each transistor in a column are commonly connected by bit lines BLo...BLm to a column line decode circuit 58. The column line decode circuit 58 can be considered as a plurality m of the bit line switch circuits 31, with the SELECT signal being generated responsive to the column address 38. The output of the column line decode circuit 58 on line 25 is a read output and is connected to the sense amplifier circuit 24. The sense amplifier 24 contains sense amplifiers and bit line load circuits. The column line decode circuit 58 receives a write input on line 27 from the programmable load circuit 32. The programmable load circuit is controlled by the load control signals 38. During a program or erase operation the bit lines BLo to BLm are selectively connected to the programmable load circuit 32. During a read operation the selected bit line (or bit lines) is connected to a sense amplifier in the sense amplifier circuit 24. The sense amplifier circuit 24 also receives a reference signal REF on line 72 and generates an output signal on the data line (DL) on line 23.

It will be appreciated that when a particular cell is chosen to be programmed, the programming load will only be applied to a selected column so that other cells in the same row as the selected cell are not inadvertently programmed. In addition in general during read and program operations it is desirable to apply certain signals to cells in the array which have not been selected to improve the performance of the cell, as is well known in the art. During an erase operation every cell in the memory array is erased, although it will be appreciated by a person skilled in the art that an array could be split into sectors for erasing so that only part of the array is erased at any one time. The table of FIG. 6 shows the voltages which need to be applied to the selected and unselected cells for each of a program, erase and read operation.

While the invention has been described in relation to a flash EPROM, it will be appreciated that the power-on reset circuit described has many applications not just in the field of memories but more generally to any arrangement which requires a power-on reset circuit.

I claim:

1. A power-up circuit for generating a power-up signal responsive to a supply voltage rising from a reference voltage to a steady supply voltage, comprising:
   a detection stage including a pull-up circuit receiving the supply voltage and a first switch connected in series with the pull-up circuit between the supply voltage and the reference voltage, the pull-up circuit and the first switch defining a control node therebetween;
   an output stage operable to generate the power-up signal when the supply voltage exceeds a preset threshold, the output stage including a second switch and a pull-down circuit connected in series with the second switch between the supply voltage and the reference voltage, the pull-down circuit and the second switch defining an output node therebetween, the pull-down circuit having an input connected to the control node of the detection stage;
   a control circuit connected to the detection stage and the output stage, and operable to switch off the first and second switches to cut off the flow of current through the first and second switches when the supply voltage is at the steady supply voltage; and
   a capacitor connected to the control node and operable to filter noise on the supply voltage.

2. The power-up circuit according to claim 1 wherein the pull-up circuit includes a natural p-channel MOSFET transistor.

3. A power-up circuit for generating a power-up signal responsive to a supply voltage rising from a reference voltage to a steady supply voltage, comprising:
   a detection stage including a pull-up circuit receiving the supply voltage and a first switch connected in series with the pull-up circuit between the supply voltage and the reference voltage, the pull-up circuit and the first switch defining a control node therebetween;
   an output stage operable to generate the power-up signal when the supply voltage exceeds a preset threshold, the output stage including a second switch and a pull-down circuit connected in series with the second switch between the supply voltage and the reference voltage, the pull-down circuit and the second switch defining an output node therebetween, the pull-down circuit having an input connected to the control node of the detection stage;
   a control circuit connected to the detection stage and the output stage, and operable to switch off the first and second switches to cut off the flow of current through the first and second switches when the supply voltage is at the steady supply voltage; and
   wherein the output stage further includes:
      a first inverter having an input connected to the output node; and
      a second inverter connected in series with the first inverter, the output of the second inverter defining the output of the power-up circuit.

4. The power-up circuit according to claim 3 wherein the first and second inverters define a feedback node therebetween and the control circuit includes:
   a first feedback inverter connected between the feedback node and the first switch, and operable to switch off the first switch; and
   a second feedback inverter connected between the feedback node and the second switch, and operable to switch off the second switch.

5. A flash EPROM comprising:
   a logic circuit having an input for receiving a power-up signal generated in response to a supply voltage rising from a reference voltage to a steady supply voltage; and
   a power-up circuit connected to the logic circuit and including
      a detection stage including a pull-up circuit receiving the supply voltage and a first switch connected in series with the pull-up circuit between the supply voltage and the reference voltage, the pull-up circuit and the first switch defining a control node therebetween;
      an output stage operable to generate the power-up signal when the supply voltage exceeds a preset threshold, the output stage including a second switch and a pull-down circuit connected in series with the second switch between the supply voltage and the reference voltage, the pull-down circuit and the second switch defining an output node therebetween, the pull-down circuit having an input connected to the control node of the detection stage; and
      a control circuit connected to the detection stage and the output stage, and operable to switch off the first and second switches to cut off the flow of current through the first and second switches when the supply voltage is at the steady supply voltage;

wherein the output stage further includes:
   a first inverter having an input connected to the output node; and
   a second inverter connected in series with the first inverter, the output of the second inverter defining the output of the power-up circuit.

6. A threshold detection circuit for generating a detection signal when a power supply voltage exceeds a predetermined threshold, said circuit comprising:
   a first detection stage connected between the power supply voltage and a reference voltage and comprising a first pull up device and a first switching device connected in series and providing a control node therebetween;
   a second detection stage connected between the power supply voltage and the reference voltage and comprising a controllable pull down device and a second switching device connected in series and providing an output node therebetween, said controllable pull down device having a control terminal coupled to said control node;
   control circuitry including first and second feedback inverters operable to switch off said first and second switching devices when said supply voltage exceeds said predetermined threshold so as to prevent DC current flow through said first and second switching devices, wherein said second detection stage further includes first and second output inverters connected in series between the output node and an output of said threshold detection circuit, the detection signal being provided at the output of said second output inverter.

7. A circuit as claimed in claim 6, wherein the inputs of said first and second feedback inverters are connected to the output of said first output inverter.

8. A circuit as claimed in claim 7, wherein said detection signal drops from a relatively high voltage level to a relatively low voltage level when said supply voltage exceeds said threshold.

9. A circuit as claimed in claim 8, wherein said first and second switching devices and said first pull up device and said controllable pull down device are all MOSFET devices.

10. A power-up circuit for generating a power-up signal responsive to a supply voltage rising from a reference voltage to a steady supply voltage, comprising:
   a detection stage including first and second switches connected in series with each other between first and second power supply terminals, the first and second switches defining a control node therebetween;
   an output stage operable to generate the power-up signal when the supply voltage exceeds a preset threshold, the output stage including third and fourth switches connected in series with each other between the first and second power supply terminals, the fourth and third switches defining an output node therebetween, the fourth switch having an input connected to the control node of the detection stage;
   a control circuit connected to the detection stage and the output stage, and operable to switch off the second and third switches to cut off the flow of current through the second and third switches when the supply voltage is at the steady supply voltage; and
   wherein the output stage further includes:
      a first inverter having an input connected to the output node; and
      a second inverter connected in series with the first inverter, the output of the second inverter defining the output of the power-up circuit.

* * * * *